(12) United States Patent
McKay et al.

(10) Patent No.: US 8,447,548 B2
(45) Date of Patent: May 21, 2013

(54) METHOD USING TIME TO DIGITAL CONVERTER FOR DIRECT MEASUREMENT OF SET PULSE WIDTHS

(75) Inventors: Anthony L. McKay, Auburn, WA (US); Jeremy Popp, Duvall, WA (US)

(73) Assignee: The Boeing Company, Chicago, IL (US)

( * ) Notice: Subject to any disclaimer, the term of this patent is extended or adjusted under 35 U.S.C. 154(b) by 407 days.

(21) Appl. No.: 12/419,842

(22) Filed: Apr. 7, 2009

(65) Prior Publication Data

US 2010/0256937 A1 Oct. 7, 2010

(51) Int. Cl.
*G01R 29/02* (2006.01)
(52) U.S. Cl.
USPC .................. 702/79; 702/66; 702/67
(58) Field of Classification Search
USPC ....... 702/66, 67, 69, 79; 327/31–38; 250/271, 250/286
See application file for complete search history.

(56) References Cited

U.S. PATENT DOCUMENTS

| | | | | |
|---|---|---|---|---|
| 4,514,665 | A | * | 4/1985 | Melocik et al. ............... 318/139 |
| 5,548,249 | A | * | 8/1996 | Sumita et al. ................. 331/1 A |
| 2005/0285612 | A1 | * | 12/2005 | Heo ............................. 324/765 |
| 2008/0069292 | A1 | * | 3/2008 | Straayer et al. ................ 377/46 |

OTHER PUBLICATIONS

Eaton, P.; Benedetto, J.; Mavis, D.; Avery, K.; Sibley, M.; Gadlage, M.; Turflinger, T.; , "Single event transient pulsewidth measurements using a variable temporal latch technique," 2004, Nuclear Science, IEEE Transactions on , vol. 51, No. 6, pp. 3365-3368, Dec. 2004.*
Dudek, P.; Szczepanski, S.; Hatfield, J.V.; , "A high-resolution CMOS time-to-digital converter utilizing a Vernier delay line," Solid-State Circuits, IEEE Journal of , vol. 35, No. 2, pp. 240-247, Feb 2000.*
Yanagawa et al, Direct Measurement of SET Pulse Widths in 0.2-micro meter SOI Logic Cells Irradiated by Heavy Ions, IEEE Transactions on Nuclear Science, vol. 53, No. 6, Dec. 2006, pp. 3575-3578.*
Dudek, P.; Szczepanski, S.; Hatfield, J.V.; , "A high-resolution CMOS time-to-digital converter utilizing a Vernier delay line," Solid-State Circuits, IEEE Journal of , vol. 35, No. 2, pp. 240-247, Feb. 2000.*
Tisa, S.; Lotito, A.; Giudice, A.; Zappa, F.; , "Monolithic time-to-digital converter with 20ps resolution," Solid-State Circuits Conference, 2003. ESSCIRC '03. Proceedings of the 29th European , vol., No., pp. 465-468, Sep. 16-18, 2003.*
Eaton, P.; Benedetto, J.; Mavis, D.; Avery, K.; Sibley, M.; Gadlage, M.; Turflinger, T.; , "Single event transient pulsewidth measurements using a variable temporal latch technique," 2004, Nuclear Science, IEEE Transactions on , vol. 51, No. 6, pp. 3365- 3368, Dec. 2004.*
Barak, J.; Adler, E.; Lifshitz, Y.; Levinson, J.; , "Detecting heavy ions and protons in space: single-events monitor ," Electrical and Electronics Engineers in Israel, 1995., Eighteenth Convention of , vol., No., pp. 5.5.1/1-5.5.1/3, Mar. 7-8, 1995.*

(Continued)

*Primary Examiner* — Sujoy Kundu
*Assistant Examiner* — Michael Dalbo

(57) ABSTRACT

The disclosure provides for a method for identifying and measuring a signal pulse induced in a microcircuit due to ionizing radiation. The method comprises locating an ionizing radiation induced pulse across a microcircuit using a plurality of sensors on the microcircuit. The method further comprises radiating a radiation through the microcircuit to produce a pulse width. The method further comprises using a time to digital converter (TDC) to measure a duration of the pulse width to create a measured pulse width. The method further comprises using the TDC to convert the measured pulse width into a digital signal.

17 Claims, 8 Drawing Sheets

OTHER PUBLICATIONS

Andaloussi, M.S., et al., "A Novel Time-To-Digital Converter with 150 ps time resolution and 2.5 ns Pulse-Pair resolution," Microelectronics, The 14rh International Conference on 2002—ICM, Dec. 11-13, 2002, p. 123-126.

Baze, M.P., et al., "Propagating SET Characterization Technique for Digital CMOS Libraries," IEEE Transactions on Nuclear Science, vol. 53, No. 6, Dec. 2006.

Balasubramanian, A., et al, "Implications of Total Dose on Single-Event Transient (SET) Pulse Width Measurement Techniques," IEEE Transactions on Nuclear Science, vol. 55, No. 6, Dec. 2008.

Tonietto, R., et al., "A 3MHz Bandwidth Low Noise RF All Digital PLL with 12ps Resolution Time to Digital Converter," Solid-State circuits conference, 2006. ESSCIRC 2006. Proceedings of the 32nd European, Sep. 2006 p. 150-153.

Yanagawa, Y., et al., "Direct measurement of SET Pulse Widths in 0.2-um SOI Logic Cells Irradiated by Heavy Ions," IEEE Transactions on Nuclear Science, vol. 53, No. 6, Dec. 2006.

Yousif, A.S., et al., "A Fine Resolution TDC Architecture for Next Generation PET Imaging," IEEE Transactions on Nuclear Science, vol. 54, No. 5, Oct. 2007.

* cited by examiner

METHOD USING TIME TO DIGITAL CONVERTER FOR DIRECT MEASUREMENT OF SET PULSE WIDTHS

GOVERNMENT RIGHTS

This invention was made with Government support under contract number HR0011-04-C-0106 awarded by the Defense Advanced Research Projects Agency. The government has certain rights in this invention.

BACKGROUND

1) Field of the Disclosure

The disclosure relates to time to digital converters. In particular, the disclosure relates to time to digital converters for direct measurement of SET (single event transient) pulse widths.

2) Description of Related Art System on chip (SoC) refers to integrating all components of a computer or other electronic system into a single integrated circuit or chip. SoC may comprise very complex application specific integrated circuits (ASIC), which can be susceptible to ionizing radiation. Ionizing radiation consists of subatomic particles or electromagnetic waves that are energetic enough to detach electrons from atoms or molecules, ionizing them. Such ionizing radiation can cause disruption inside the SoC or integrated circuit or chip. A time to digital converter (TDC) may be utilized as a measuring instrument to determine the pulse width created by the interaction with the ionizing radiation. SoC can experience radiation effects on earth and in space. The TDC can be utilized as a measuring instrument on integrated circuit or chip performance in a control loop to allow the SoC to compensate for the radiation effects.

Known methods exist for different circuit designs which capture the pulse information using delay flip flops and latches. Delay flip flops are integrated circuits that have a clock input and a data input. However, such known methods do not perform processing of the data directly on the integrated circuit or chip. Moreover, such known methods require external data manipulation and external data mining techniques to derive the pulse width information. Such techniques can be redundant, time consuming, costly, and can increase the size of the electronics.

In addition, single event transients (SETs) in combinational logic can be a source for errors in advanced digital integrated circuits or chips. As a result, it is important to know the SET pulse characteristics, and in particular, the SET pulse width, to estimate the vulnerability of a given circuit. Known methods for characterizing SETs exist. Such known methods include measuring pulse width indirectly by calculating a cross-section of events generated from such SETs. However, such known methods require external data mining techniques and involve increased time and expense to carry out.

Accordingly, there is a need for a method using a time to digital converter that provides advantages over known methods and systems.

SUMMARY

This need for a method using a time to digital converter (TDC) that provides advantages over known methods and systems is satisfied. Unlike known methods and systems, embodiments of the method using the TDC of the disclosure may provide one or more of the following advantages: provides a method using a TDC that allows measurement directly on the microcircuit or chip of pulse widths created by single event transients (SETs) and gated clocks transients caused by power on circuitry; provides a method using a TDC that converts the pulse width information at the TDC input into a digital word at the TDC output and can be used on chip in a control loop or read out to a data collection device or instrument; provides a method using a TDC that has utilization for improving functionality of electronic integrated circuit (IC) chips used onboard space systems, such as satellites and space shuttles, and is also applicable to operation electronic systems using IC chips; provides a method using a TDC that detects a pulse and measures the duration of the pulse directly on the microcircuit or chip; provides a method using a TDC that uses simplified delay paths or elements to reduce input loading and reduce the total number of delay paths or elements; provides a method using a TDC that in one embodiment allows for variable delay via the use of current starved inverters; provides a method using a TDC that in another embodiment uses a vernier delay method that allows for very long chains or a larger number of digital bits to vary both the size of the pulse width to be measured and the resolution accuracy; provides a method using a TDC that can be used with special circuitry to test and calibrate the TDC to determine the accuracy and the pulse width measurements resolution; and, provides a method using a TDC that does not require external data manipulation or external data mining techniques to derive the pulse width information, does not increase the size of the electronics, and that is less time consuming and costly.

In an embodiment of the disclosure, there is provided a method for identifying and measuring a signal pulse induced in a microcircuit due to ionizing radiation. The method comprises locating an ionizing radiation induced pulse across a microcircuit using a plurality of sensors on the microcircuit. The method further comprises radiating a radiation through the microcircuit to produce a pulse width. The method further comprises using a time to digital converter (TDC) to measure a duration of the pulse width to create a measured pulse width. The method further comprises using the TDC to convert the measured pulse width into a digital signal. Optionally, the method further comprises calibrating the TDC with a voltage control circuitry to determine a resolution accuracy of the pulse width and a measurement resolution of the pulse width.

In another embodiment of the disclosure, there is provided a method for identifying and measuring a signal pulse induced in a microcircuit due to ionizing radiation. The method comprises locating an ionizing radiation induced pulse across a microcircuit using a plurality of sensors on the microcircuit. The method further comprises radiating a radiation through the microcircuit to produce a pulse width. The method further comprises using a time to digital converter (TDC) to measure a duration of the pulse width to create a measured pulse width. The method further comprises using a current starved inverter with the TDC to allow for a variable delay of the pulse width. The method further comprises using the TDC to convert the measured pulse width into a digital signal. Optionally, the method further comprises calibrating the TDC with a voltage control circuitry to determine a resolution accuracy of the pulse width and a measurement resolution of the pulse width.

In another embodiment of the disclosure, there is provided a method for identifying and measuring a signal pulse induced in a microcircuit due to ionizing radiation. The method comprises locating an ionizing radiation induced pulse across a microcircuit using a plurality of sensors on the microcircuit. The method further comprises radiating a radiation through the microcircuit to produce a pulse width. The method further comprises using a time to digital converter (TDC) to measure a duration of the pulse width to create a measured pulse width. The method further comprises using two delay paths and a digital adder with the TDC, wherein the delay paths are compared to derive a measurement of the pulse width. The method further comprises using the TDC to convert the measured pulse width into a digital signal. Optionally, the method further comprises calibrating the TDC with a voltage control circuitry to determine a resolution accuracy of the pulse width and a measurement resolution of the pulse width.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary embodiments, but which are not necessarily drawn to scale, wherein.

DETAILED DESCRIPTION

Disclosed embodiments will now be described more fully hereinafter with reference to the accompanying drawings, in which some, but not all of the disclosed embodiments are shown. Indeed, several different embodiments may be provided and should not be construed as limited to the embodiments set forth herein. Rather, these embodiments are provided so that this disclosure will be thorough and complete and will fully convey the scope of the disclosure to those skilled in the art.

The disclosure provides for embodiments of a method for using a time to digital converter (TDC) for direct measurement of single event transient (SET) pulse widths. The method of using the TDC may be used in spacecraft, satellites, space shuttles, and other suitable space systems, as well as in aircraft, and other craft and vehicles. Accordingly, one of ordinary skill in the art will recognize and appreciate that the method of using the TDC of the disclosure can be used in any number of applications involving spacecraft, satellites, space shuttles, and other suitable space systems, as well as in aircraft, and other craft and vehicles.

Figure 1:
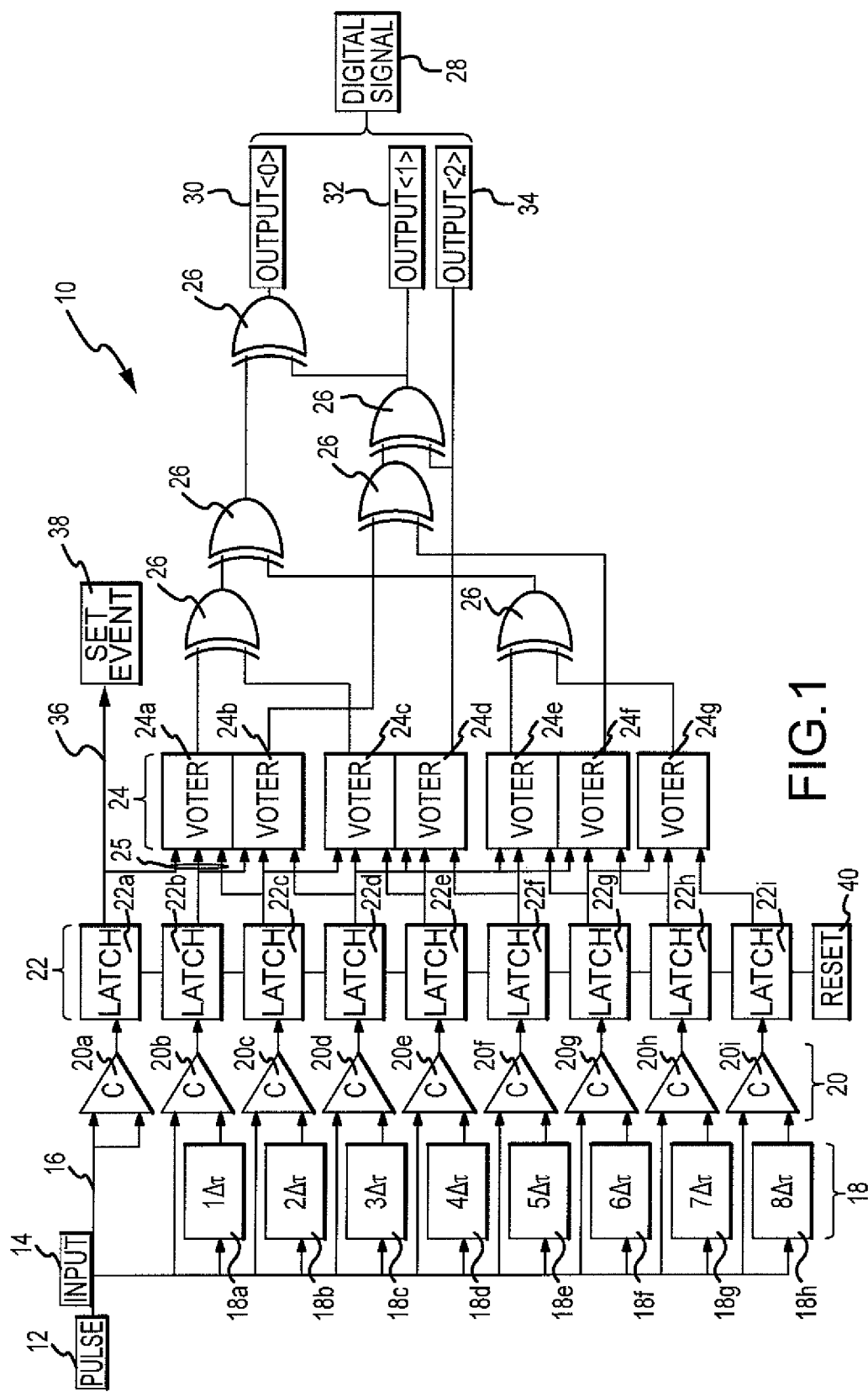
FIG. 1 is an illustration of a circuit diagram of one of the embodiments of the time to digital converter (TDC) circuit of the disclosure.

Referring more particularly to the drawings, FIG. 1 is an illustration of a circuit diagram of one of the embodiments of a time to digital converter (TDC) circuit 10 of the disclosure. In this embodiment of the TDC circuit 10, a pulse 12 or signal pulse enters the TDC circuit 10 at pulse input 14. One or more pulses 12 may enter the TDC circuit 10. The pulse 12 may transmit with no delays through path 16. The pulse 12 may transmit with delays through delay paths 18 1-8 $\Delta\tau$ (delta tau). The delay paths 18 may comprise delay paths 18a (1$\Delta\tau$), 18b (2$\Delta\tau$), 18c (3$\Delta\tau$), 18d (4$\Delta\tau$), 18e (5$\Delta\tau$), 18f (6$\Delta\tau$), 18g (7$\Delta\tau$), and 18h (8$\Delta\tau$). The TDC circuit 10 shows eight (8) delay paths 18. However, more or less delay paths 18 may be used. The pulse 12 transmits from path 16 and/or delay paths 18 to C (circuit) gates 20. The C gates 20 may comprise C gates 20a, 20b, 20c, 20d, 20e, 20f, 20g, 20h, and 20i. The TDC circuit 10 shows nine (9) C gates 20. However, more or less C gates 20 may be used. A first C gate 20a has no delays on it, so the pulse 12 can go through C gate 20a. The pulse 12 transmits from the C gates 20 to latches 22. The latches 22 may comprise latches 22a, 22b, 22c, 22d, 22e, 22f, 22g, 22h, and 22i. The TDC circuit 10 shows nine (9) latches 22. However, more or less latches 22 may be used. The C gates 20 feed into the latches 22. If the pulse 12 is smaller than the delay path 18, then the latch 22 is not triggered. If the pulse 12 is wider or greater than the delay path 18, then the latch 22 is triggered. If the pulse 12 is wide enough or large enough to get through a C gate 20, the latch 22 is triggered. At this point, the TDC circuit 10 has detected the pulse 12 but the TDC circuit 10 does not know how wide or large the pulse 12 is yet. For example, if the pulse 12 is wider than delay path 18b (2$\Delta\tau$), it goes through corresponding C gate 20c, and corresponding latch 22c is triggered. However, if for example, the pulse 12 is smaller than delay path 18c (3$\Delta\tau$), it does not go through corresponding C gate 20d, and corresponding latch 22d is not triggered. As a result, the remaining subsequent latches 22 down the path are not triggered. If the pulse 12 is wider or larger than the delay paths 18, the pulse 12 gets through. If the pulse 12 is smaller than the delay paths 18, the pulse 12 does not get through. For example, if the pulse 12 only goes through delay path 18b (2$\Delta\tau$) and only goes through corresponding C gate 20c, then only latches 22a, 22b, 22c are triggered or turned on and the remaining subsequent latches 22 are zero. The latches 22 are coupled to voter circuits 24. The voter circuits 24 may comprise voter circuits 24a, 24b, 24c, 24d, 24e, 24f, and 24g. By example, the pulse 12 can then transmit from latches 22a, 22b, 22c to a first voter circuit 24a which has three inputs 25. The three inputs 25 comprise the same information, that is, all three of the inputs 25 have to be 1 or all three of the inputs 25 have to be zero. If only two of the inputs 25 are 1's and one is zero, then the two 1's win because there are more votes for 1. If there are two zeros and one 1, then the two zeros win because there are more votes for zero. If the first voter circuit 24a sees all three latches 22a, 22b, 22c are 1, the output is a 1. A second voter circuit 24b sees only 2 of them as being a 1, so the output is 1. However, the remaining subsequent voter circuits 24 do not have enough information to recognize a 1, so they remain zero. By example, the pulse 12 then transmits from the first voter circuit 24a to exclusive or gates 26 which act as decoders. The exclusive or gate 26 processes a 1 at the output if there is a 1 and a zero at the input. The exclusive or word 26 processes a zero at the output if there are two zeros at the input. The exclusive or gate 26 processes a zero at the output if there are two 1's at the input. As is shown in FIG. 1, the TDC circuit 10 has eight delay paths 18 and can provide eight different pulse width pieces of information. The TDC circuit 10 takes the pulse width information from the latches that are triggered, such as, by example, 22a, 22b, 22c and converts the pulse width information to a digital word or digital signal 28 that can be used by a processor (not shown) directly. The digital word or digital signal 28 may comprise first output 30 (<0>), second output 32 (<1>), and third output 34 (<2>) of digital bits to describe one of the eight states. The TDC circuit 10 may have more or less outputs. Depending on the number of latches 22 that get triggered, the TDC circuit 10 can put one of the eight digital words or digital signals 28 at the outputs 30, 32, 34. An output 36 of a first latch 22a may be a single event transient (SET) event 38. When the pulse 12 transmits, the first latch 22a has no delays so the first latch 22a recognizes the pulse 12 no matter how small it is, and that is the event. As the pulse 12 goes through the other delay paths 18, the pulse 12 gets measured and decoded to produce the outputs 30, 32, 34 of the digital word or digital signal 28. As shown in FIG. 1, the latches 22 may include a reset 40. After a pulse width measurement is taken, it is possible to reset the latches 22 to take another pulse width measurement.

Figure 6:
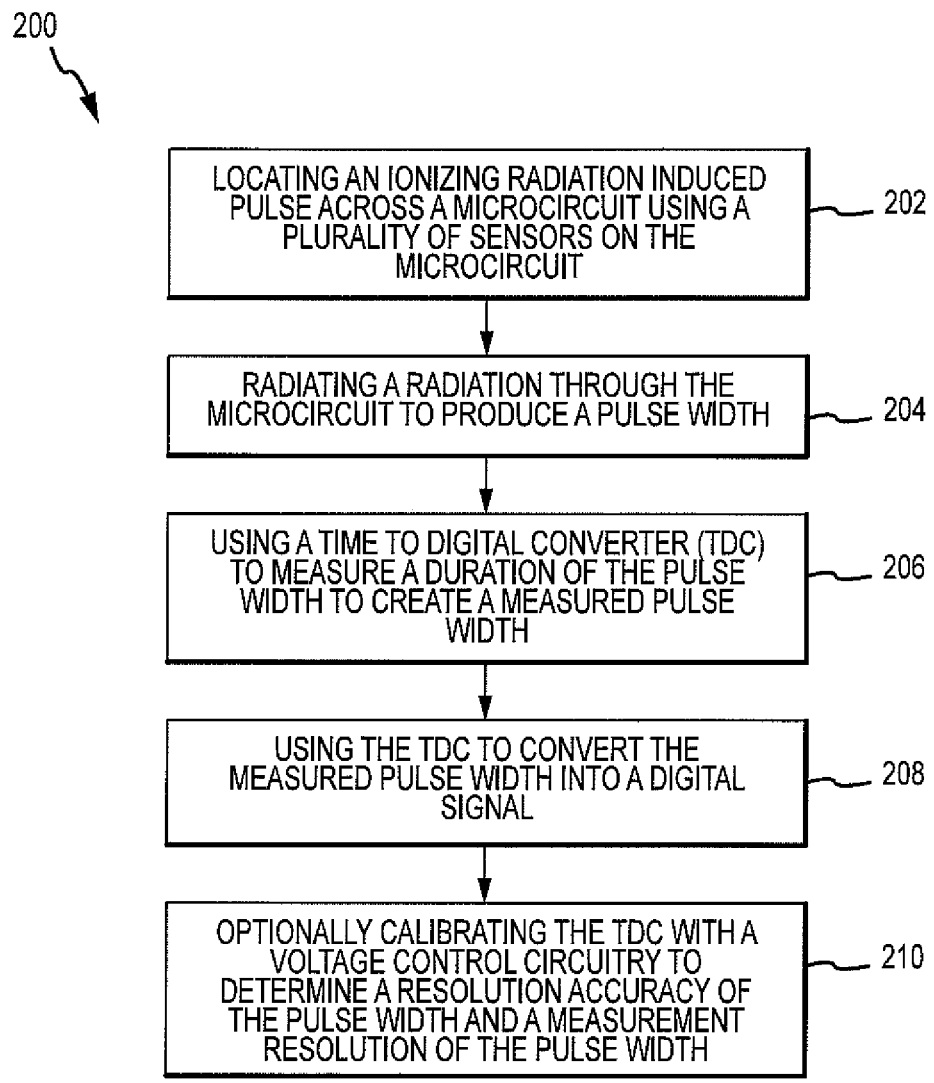
FIG. 6 is an illustration of a block flow diagram of the steps of one of the embodiments of the method of the disclosure.

FIG. 6 is an illustration of a block flow diagram of the steps of one of the embodiments of a method 200 for identifying and measuring a signal pulse 12 induced in a microcircuit due to ionizing radiation that may use the TDC circuit 10. The method 200 comprises step 202 of locating an ionizing radiation induced pulse across a microcircuit using a plurality of sensors (not shown) on the microcircuit. The ionizing radiation induced pulse may be created by target circuitry which is the signal pulse that is input to the TDC 10. The microcircuit may comprise an electronic integrated circuit chip. The plurality of sensors are preferably spaced apart from each other on the microcircuit. The TDC 10 is coupled to the sensors that reside on the microcircuit. The sensors are blocks of logic which act as targets for the ionizing radiation induced pulse or particles. The method 200 further comprises step 204 of radiating a radiation through the microcircuit to produce a pulse width 12. The method 200 further comprises step 206 of using a time to digital converter (TDC) 10 to measure a duration of the pulse width 12 to create a measured pulse width. The method 200 further comprises step 208 of using the TDC 10 to convert the measured pulse width into a digital word or digital signal 28. Optionally, the method 200 may further comprise step 210 of calibrating the TDC with a voltage control circuitry 110 (see FIG. 4) to determine a resolution accuracy of the pulse width and a measurement resolution of the pulse width. The TDC 10 allows direct measurement of the pulse width on the microcircuit. The pulse width is created by a single event transient (SET) or a gated clock transient caused by power on the microcircuit. The TDC 10 converts information on the pulse width at a TDC pulse input 14 into a digital word or digital signal 28 at one or more TDC outputs 30, 32, 34 (see FIG. 1), where the digital word or digital signal 28 can be transmitted to a data collection device or instrument (not shown). The digital word or digital signal 28 can be used on the microcircuit in a control loop. The method may be used with onboard space systems comprising satellites and space shuttles or other suitable craft and vehicles.

Figure 2:
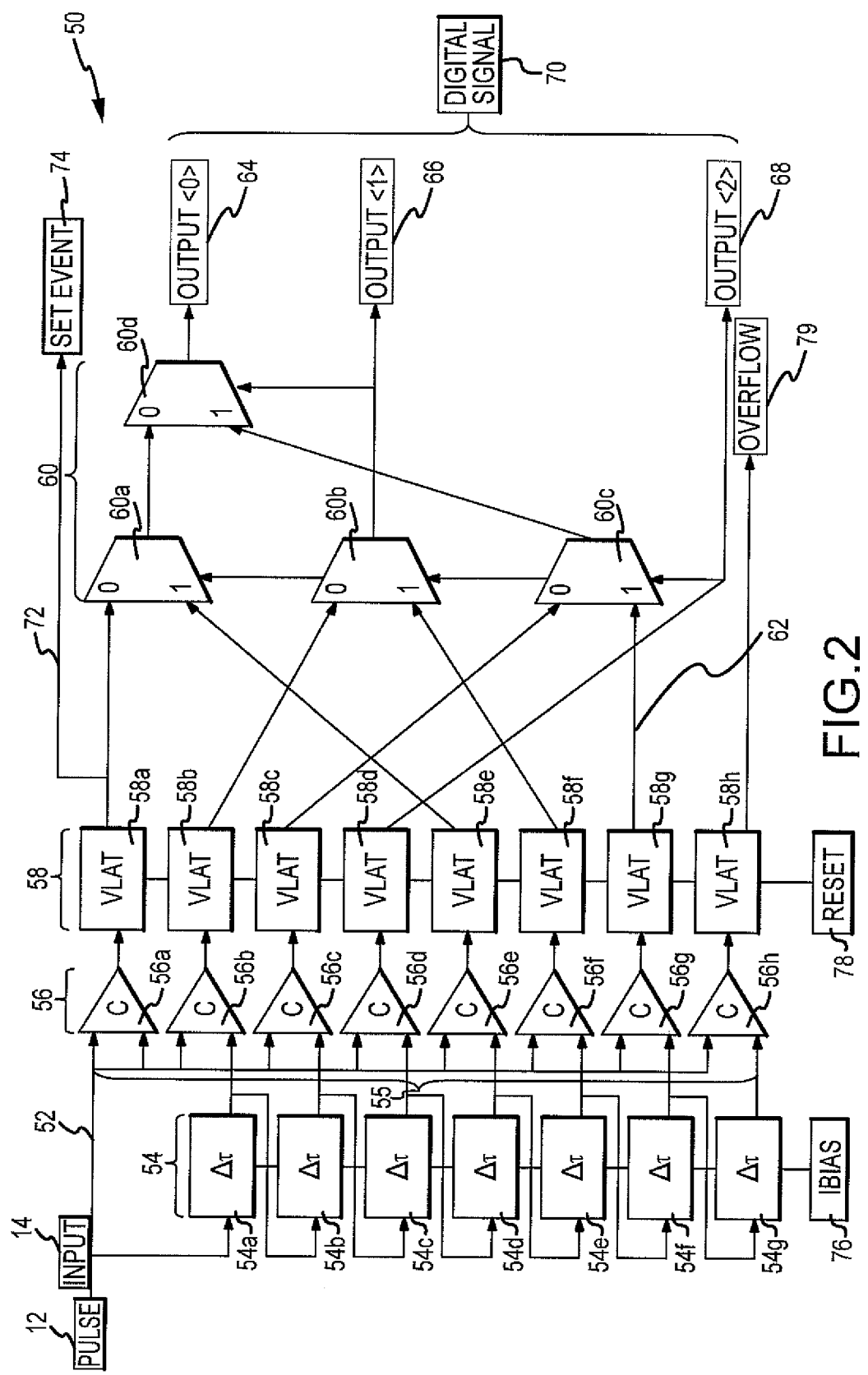
FIG. 2 is an illustration of a circuit diagram of another one of the embodiments of the TDC circuit of the disclosure.

FIG. 2 is an illustration of a circuit diagram of another one of the embodiments of a TDC circuit 50 of the disclosure. In this embodiment of the TDC circuit 50, a pulse 12 or signal pulse enters the TDC circuit 50 at pulse input 14. The TDC circuit 50 may be used under 45 nanometers. One or more pulses 12 may enter the TDC circuit 50. The pulse 12 may transmit with no delays through path 52. The pulse 12 may transmit with delays through delay paths 54 Δτ (delta tau). Delay paths 54 may comprise delay paths 54a, 54b, 54c, 54d, 54e, 54f, and 54g. The TDC circuit 50 shows seven (7) delay paths 54. However, more or less delay paths 54 may be used.

In this embodiment, the delay pulse is measured with the pulse input. With the TDC circuit 50, the number of delays and delay paths 54 is decreased, preferably by half, over the delay paths 18 of the TDC circuit 10. The pulse 12 transmits from path 52 and/or delay paths 54 to C (circuit) gates 56. The C gates 56 may comprise C gates 56a, 56b, 56c, 56d, 56e, 56f, 56g, and 56i. The TDC circuit 50 shows eight (8) C gates 56. However, more or less C gates 56 may be used. The pulse 12 goes through the delay paths 54 and inputs 55 to the C gates 56 are tied together in parallel. A first C gate 56a has no delays on it, so the pulse 12 can go through C gate 56a. The pulse 12 transmits from the C gates 56 to voter latches 58. The voter latches 58 may comprise voter latches 58a, 58b, 58c, 58d, 58e, 58f, 58g, and 58h. The TDC circuit 50 shows eight (8) voter latches 58. However, more or less voter latches 58 may be used. Each voter latch 58 may comprise three latches and a voter. The voter is voting on the latches, and it is releasing a single output. The C gates 56 feed into the voter latches 58. If the pulse 12 is smaller than the delay path 54, then the voter latch 58 is not triggered. If the pulse 12 is wider or greater than the delay path 54, then the voter latch 58 is triggered. The voter latches 58 are coupled to multiplexers 60 which act as decoding logic similar to exclusive or gates 26. The multiplexers may comprise multiplexers 60a, 60b, 60c, and 60d. By example, the pulse 12 can transmit from first voter latch 58a to first multiplexer 60a, from a second voter latch 58b to second multiplexer 60b, from a third voter latch 58c to third multiplexer 60c, and from first multiplexer 60a and third multiplexer 60c to fourth multiplexer 60d. By example, the pulse 12 can then transmit from the fourth multiplexer 60d to first output 64 (<0>), from second multiplexer 60b to a second output 66 (<1>), and from third multiplexer 60c to a third output 68 (<2>) of digital bits. Data line 62 extends from voter latch 58g to third multiplexer 60c. There can be one or more data lines that extend from the voter latches to the multiplexers. As is shown in FIG. 2, the TDC circuit 50 has seven delay paths 54 and can provide seven different pulse width pieces of information. The TDC circuit 50 takes the pulse width information from the voter latches 58 and converts the pulse width information to a digital word or digital signal 70 that can be used by a processor (not shown) directly. The digital word or digital signal 70 may comprise first output 64 (<0>), second output 66 (<1>), and third output 68 (<2>) of digital bits to describe one of the seven states. The TDC circuit 50 may have more or less outputs. Depending on the number of voter latches 58 that get triggered, the TDC circuit 50 can transmit one of the seven digital words or digital signals 70 at the outputs 64, 66, 68. An output 72 of a first voter latch 58a may be a single event transient (SET) event indication pin 74 that is provided to ensure that the TDC circuit 50 is operating properly. When the pulse 12 transmits, the first voter latch 58a has no delays so the first voter latch 58a recognizes the pulse 12 no matter how small it is, and that is the event. As the pulse 12 goes through the other delay paths 54, the pulse 12 gets measured and decoded to produce the outputs 64, 66, 68 of the digital word or digital signal 70. As shown in FIG. 2, the TDC circuit 50 may include a current starved inverter 76 or delay cell labeled as "IBIAS" in FIG. 2, which allows for variable delay. The current starved inverted 76 may be controlled dynamically after the microcircuit or integrated circuit chip is fabricated. This is accomplished by setting a current shown in FIG. 2 as IBIAS. The current changes the intrinsic delay of the inverter stage, for example, going from tens of pico seconds of delay to up to hundreds of pico seconds of delay with the same delay cell. The embodiment of this TDC circuit 50 does not require deciding what the delay should be before fabricating the microcircuit or chip. It is possible to tune the delay after the microcircuit or chip is fabricated. The TDC circuit 50 provides for reduced loading at input, and the same delay paths. A benefit of this embodiment is that the overall area of the TDC circuit 50 is smaller. The voter latches 58 may include a reset 78 and an overflow 79. After a pulse width measurement is taken, it is possible to reset the voter latches 58 to take another pulse width measurement. The overflow 79 means that the pulse width is much longer than what is being measured.

Figure 7:
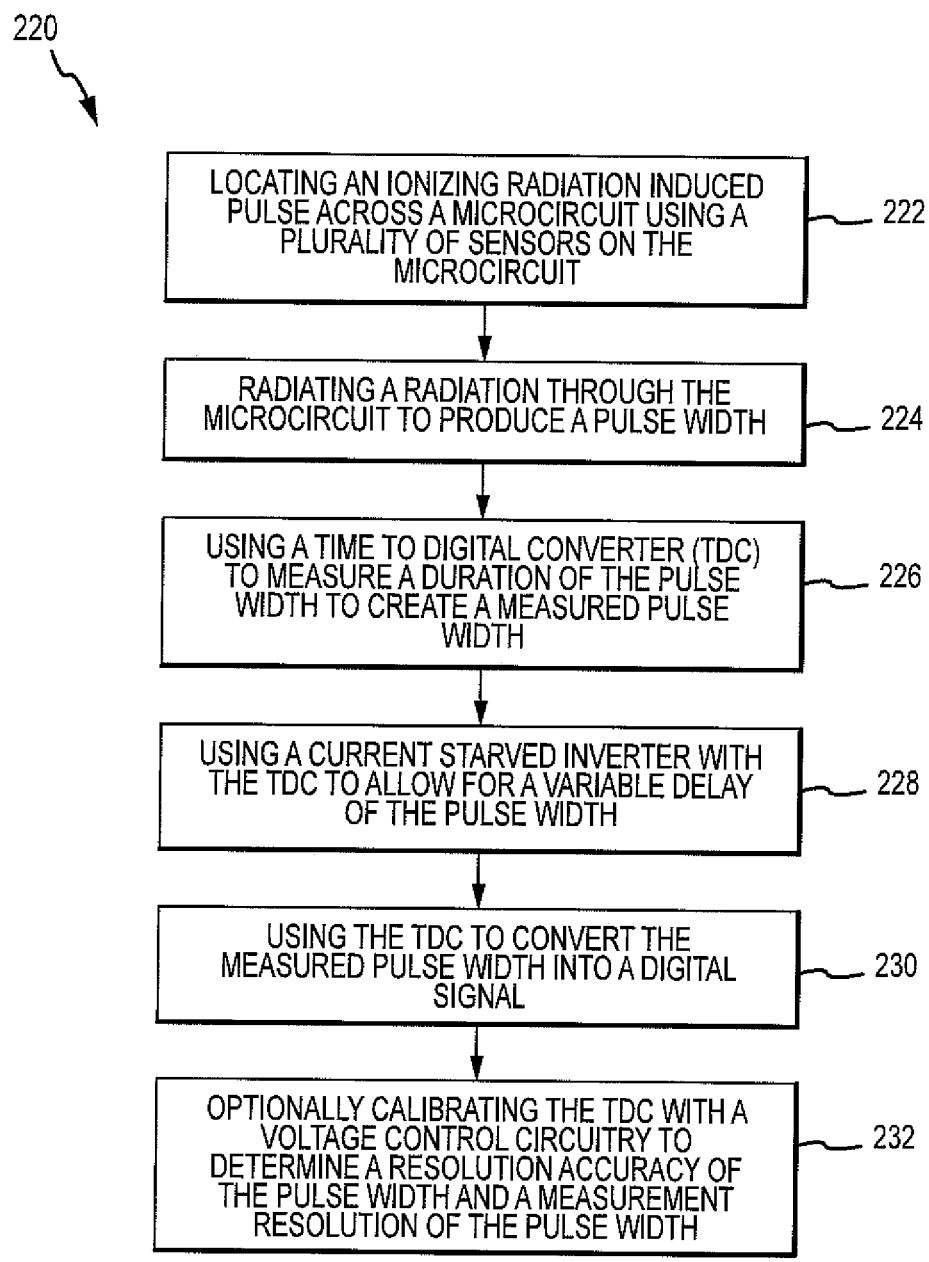
FIG. 7 is an illustration of a block flow diagram of the steps of another one of the embodiments of the method of the disclosure; and, FIG. 8 is an illustration of a block flow diagram of the steps of another one of the embodiments of the method of the disclosure.

FIG. 7 is an illustration of a block flow diagram of the steps of another one of the embodiments of a method 220 for identifying and measuring a signal pulse 12 induced in a microcircuit due to ionizing radiation that may use the TDC circuit 50. The method 220 comprises step 222 of locating an ionizing radiation induced pulse across a microcircuit using a plurality of sensors on the microcircuit. The method 220 further comprises step 224 of radiating a radiation through the microcircuit to produce a pulse width. The method 220 further comprises step 226 of using a time to digital converter (TDC) to measure a duration of the pulse width to create a measured pulse width. The method 220 further comprises step 228 of using a current starved inverter 76 with the TDC 50 to allow for a variable delay of the pulse width. The method 220 further comprises step 230 of using the TDC 50 to convert the measured pulse width into a digital signal. Optionally, the method 220 may further comprise step 232 of calibrating the TDC 50 with a voltage control circuitry 110 (see FIG. 4) to determine a resolution accuracy of the pulse width and a measurement resolution of the pulse width. The TDC 50 uses one or more voter latches 58 to reduce input loading and to reduce a total number of delay paths or elements. The TDC 50 allows direct measurement of the pulse width on the microcircuit, where the pulse width is created by a single event transient (SET) or a gated clock transient caused by power on the microcircuit. The TDC 50 has a single event transient (SET) indication output pin 74 to ensure that the TDC 50 is operating properly. The TDC 50 may use one or more multiplexers 60 as decoders. The TDC circuit 50 of this embodiment improves the ionizing radiation hardness of the latch/voter circuitry by using voting latches 58. The delay paths 54 are simplified to reduce input loading and reduce the total number of delay paths 54. The TDC 50 can directly convert the pulse width into a digital word or digital signal 70 which can be utilized on the microcircuit or chip in a control loop, or transmit or read out to a data collection device or instrument.

Figure 3:
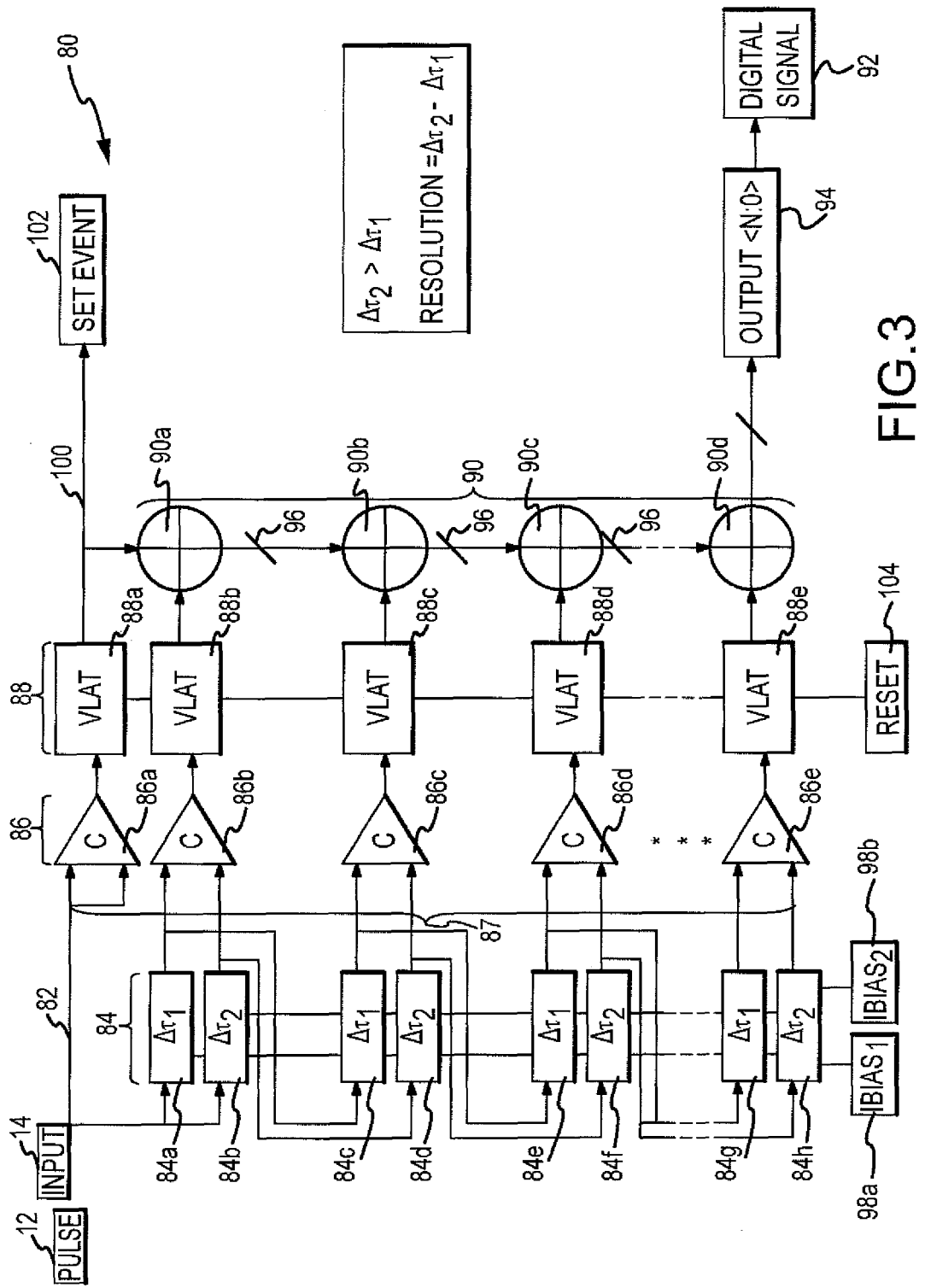
FIG. 3 is an illustration of a circuit diagram of another one of the embodiments of the TDC circuit of the disclosure.

FIG. 3 is an illustration of a circuit diagram of another one of the embodiments of a TDC circuit 80 of the disclosure. In this embodiment of the TDC circuit 80, a pulse 12 or signal pulse enters the TDC circuit 80 at pulse input 14. One or more pulses 12 may enter the TDC circuit 80. The pulse 12 may transmit with no delays through path 82. The pulse 12 may transmit with delays through a plurality of two delay paths 84 ($\Delta\tau_1$ (delta tau) and $\Delta\tau_2$ (delta tau)). The delay paths 84 may comprise delay paths 84*a*, 84*b*, 84*c*, 84*d*, 84*e*, 84*f*, 84*g*, and 84*h*. The TDC circuit 80 shows four (4) pairs of delay paths 84. However, more or less delay paths 84 may be used. Each pair of delay paths 84 may be changed with respect to one another. The $\Delta\tau_1$ gets changed with respect to $\Delta\tau_2$. The delays between the pairs of two delay paths 84 can be changed and that is how the pulse width measurement is made. The pairs of two delay paths 84 are compared to derive the pulse width measurement instead of using an exclusive or gate or multiplexer as decoders. With two different delay paths, the TDC 80 has a better resolution and a wider range of measurements may be obtained. With the TDC 80 and the pairs of two delay paths 84, $\Delta\tau_2 > \Delta\tau_1$, and the resolution equals $\Delta\tau_2$–(minus) $\Delta\tau_1$. There is no penalty for adding more delay paths or stages to the measurement. The pulse 12 transmits from path 82 and/or delay paths 84 to C (circuit) gates 86. The C gates 86 may comprise C gates 86*a*, 86*b*, 86*c*, 86*d*, and 86*e*. The TDC circuit 80 shows five (5) C gates 86. However, more or less C gates 86 may be used. The pulse 12 goes through the delay paths 84. As the number of C gates 86 is increased, the number of loading at the input is increased. This embodiment splits up the number of delay paths 84 and C gates 86, so each of the C gate inputs 87 does not have to be driven with the pulse input that is being measured. The C gate 86 essentially still has the same input, and it is using another delay cell to delay that input with respect to each other. A first C gate 86*a* has no delays on it, so the pulse 12 can go through C gate 86*a*. The pulse 12 transmits from the C gates 86 to voter latches 88. The voter latches 88 may comprise voter latches 88*a*, 88*b*, 88*c*, 88*d*, and 88*e*. The TDC circuit 80 shows five (5) voter latches 88. However, more or less voter latches 88 may be used. Each voter latch 88 may comprise three latches and a voter. The voter is voting on the latches, and it is releasing a single output. The C gates 86 feed into the voter latches 88. If the pulse 12 is smaller than the delay path 84, then the voter latch 88 is not triggered. If the pulse 12 is wider or greater than the delay path 84, then the voter latch 88 is triggered. The first voter latch 88*a* can produce a 1, and the second voter latch 88*b* can produce the next 1. The voter latches 88 are coupled to digital adders 90. Digital adders 90 may comprise first adder 90*a*, second adder 90*b*, third adder 90*c*, and fourth adder 90*d*. By example, the pulse 12 can transmit from second voter latch 88*b* to first adder 90*a*, from third voter latch 88*c* to second adder 90*b*, from fourth voter latch 88*d* to third adder 90*c*, and from fifth voter latch 88*e* to a fourth adder 90*d*. The TDC circuit 80 takes the pulse width information from the voter latches 88 and converts the pulse width information to a digital word or digital signal 92 that can be used by a processor (not shown) directly. The digital word or digital signal 92 may comprise a first output 94 <N:0>. By example, the pulse 12 can transmit from the fourth adder 90*d* to the first output 94 (<N:0>) of digital bits. The first output 94 is <N:0>, that is, N is the maximum number of bits built up and zero is the minimum number of bits. The TDC circuit 80 may have more or less outputs. The adders 90*a*, 90*b*, 90*c*, 90*d* are included next to the voter latches 88 to add the numbers from all of the other voter latches 88 prior. The adder adds 1 to whatever a digital word is as it passes down. A slash 96 represents "x" number of bits. As the size of the adder is increased, the number of bits required is increased. The result from the first adder 90*a* may only be one bit because either a zero or a 1 is being added. The result for the second adder 90*b* may be two bits because there is a potential for two 1's being added together. The TDC circuit 80 further comprises two IBIAS delay cells 98*a*, 98*b*. Preferably, the TDC 80 comprises IBIAS$_1$ (98*a*) and IBIAS$_2$ (98*b*). An output 100 of a first voter latch 88*a* may be a single event transient (SET) event 102. The voter latches 88 may include a reset 104. After a pulse width measurement is taken, it is possible to reset the voter latches 88 to take another pulse width measurement.

Figure 8:
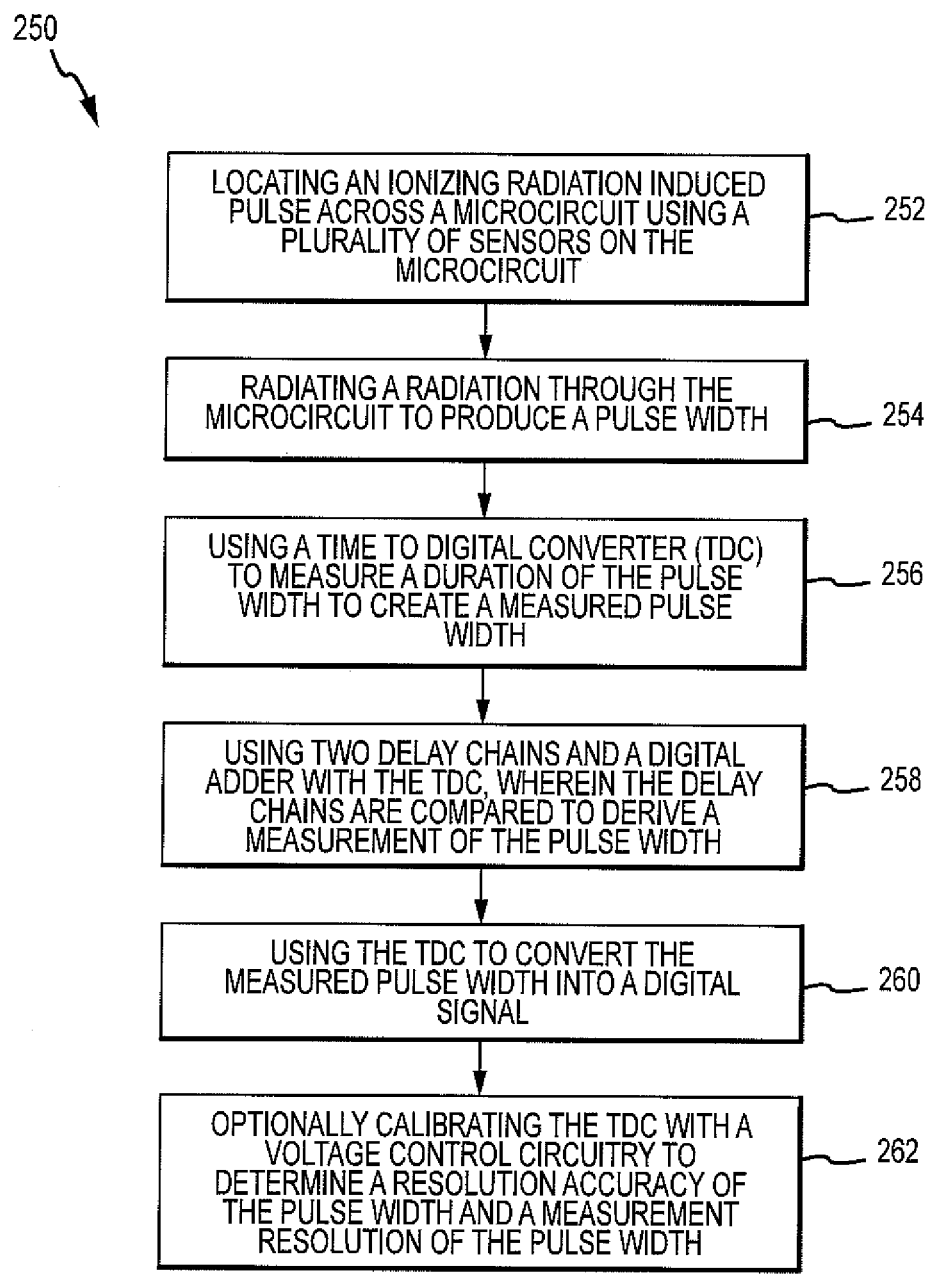

FIG. 8 is an illustration of a block flow diagram of the steps of another one of the embodiments of a method 250 for identifying and measuring a signal pulse 12 induced in a microcircuit due to ionizing radiation using the TDC circuit 80. The method 250 comprises step 252 of locating an ionizing radiation induced pulse across a microcircuit using a plurality of sensors on the microcircuit. The method 250 further comprises step 254 of radiating a radiation through the microcircuit to produce a pulse width. The method 250 further comprises step 256 of using a time to digital converter (TDC) 80 to measure a duration of the pulse width to create a measured pulse width. The method 250 further comprises step 258 of using two delay paths 84 and a digital adder 90 with the TDC, wherein the delay paths are compared to derive a measurement of the pulse width. The plurality of digital adders 90 vary a size of the pulse width to be measured and vary a resolution accuracy of the pulse width. The method 250 further comprises step 260 of using the TDC 80 to convert the measured pulse width into a digital signal. Optionally, the method 250 may further comprise step 262 of calibrating the TDC 80 with a voltage control circuitry 110 (see FIG. 4) to determine a resolution accuracy of the pulse width and a measurement resolution of the pulse width. The TDC 80 allows direct measurement of the pulse width on the microcircuit, and the pulse width is created by a single event transient (SET) or a gated clock transient caused by power on the microcircuit. The TDC 80 uses a vernier delay method that allows for a substantial number of digital bits. The vernier delay method allows for very long chains or a larger number of digital bits. Instead of using an exclusive or gate or a multiplexer, this TDC 80 uses one or more digital adders 90. This circuit design allows for pipelining the TDC to any number of stages. This TDC 80 has the capacity to vary both the size of pulse width to be measured and the resolution accuracy.

Figure 4:
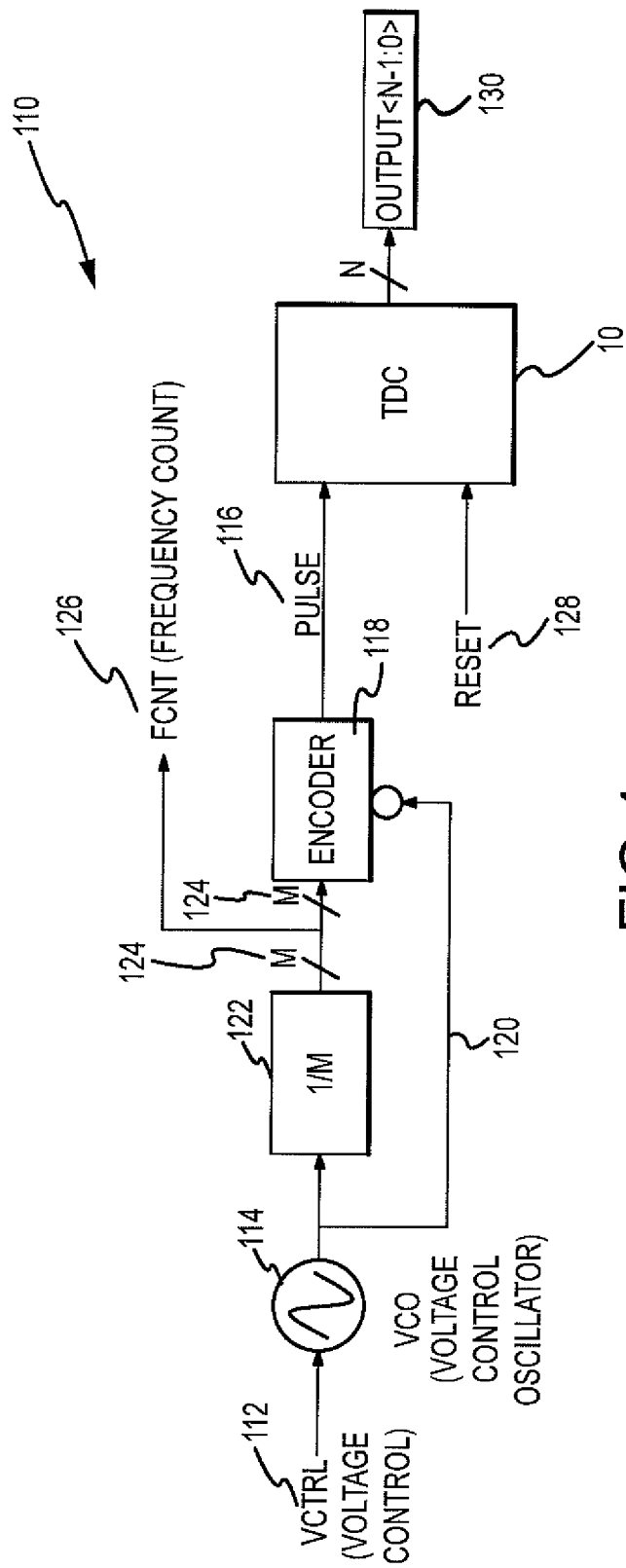
FIG. 4 is an illustration of a circuit diagram of additional circuitry that can be used with the embodiments of the TDC circuits of the disclosure.

FIG. 4 is an illustration of a circuit diagram of an additional voltage control circuitry 110 that can be used with the embodiments of the TDC circuits of the disclosure discussed above. The TDC circuits discussed above when used with the unique voltage control circuitry 110 shown in FIG. 4 can be tested and calibrated to determine the accuracy and the pulse width measurements resolution. The voltage control circuitry 110 measures a known pulse width with the TDC and steps the pulse width to larger and larger pulses until all of the different measurement delays in the TDC have been simulated. This results in knowing what each of the TDC delays are. The voltage control circuitry 110 comprises a voltage control 112 coupled to a voltage control oscillator 114. The voltage control oscillator 114 is a continuous frequency wave form having a specific frequency. The voltage control 112 controls what frequency the voltage control oscillator 114 runs at. The voltage control oscillator 114 generates a series of pulses or multiple pulses (not shown). The multiple pulses transmit from the voltage control oscillator 114 to either an encoder 118 via path 120 or to a divider 122. The divider 122 divides down the multiple pulses at $1/2^M$ where M (124) is the number of output pulses or signals from the divider 122. The output pulses or signals from the divider 122 may then transmit to a frequency counter 126 and then to an encoder 118. The encoder 118 allows a single pulse 116 to be generated through the encoder 118 to TDC 10 (or TDC 50 or TDC 80) or another suitable TDC. The pulse width is equal to the frequency count divided by $2^{M+1}$, or $fcnt/(2^{M+1})$. Since the pulse width is known and measured based on the TDC, the TDC can be calibrated as to the delay stages. The voltage control 112 may be set to a specific frequency or pulse width, the measurements may be taken based on the TDC, and the TDC may be reset with reset element 128. When the TDC is reset, the voltage control 112 can be changed to the next pulse width until all of the different delays in the TDC have been stimulated. The larger the TDC, the more pulse widths can be measured. The TDC produces output 130 which may be output <N-1:0>, where "N" is the delay cells in the TDC. The voltage control circuitry 110 is a way to test and calibrate the TDC circuits discussed above.

Figure 5:
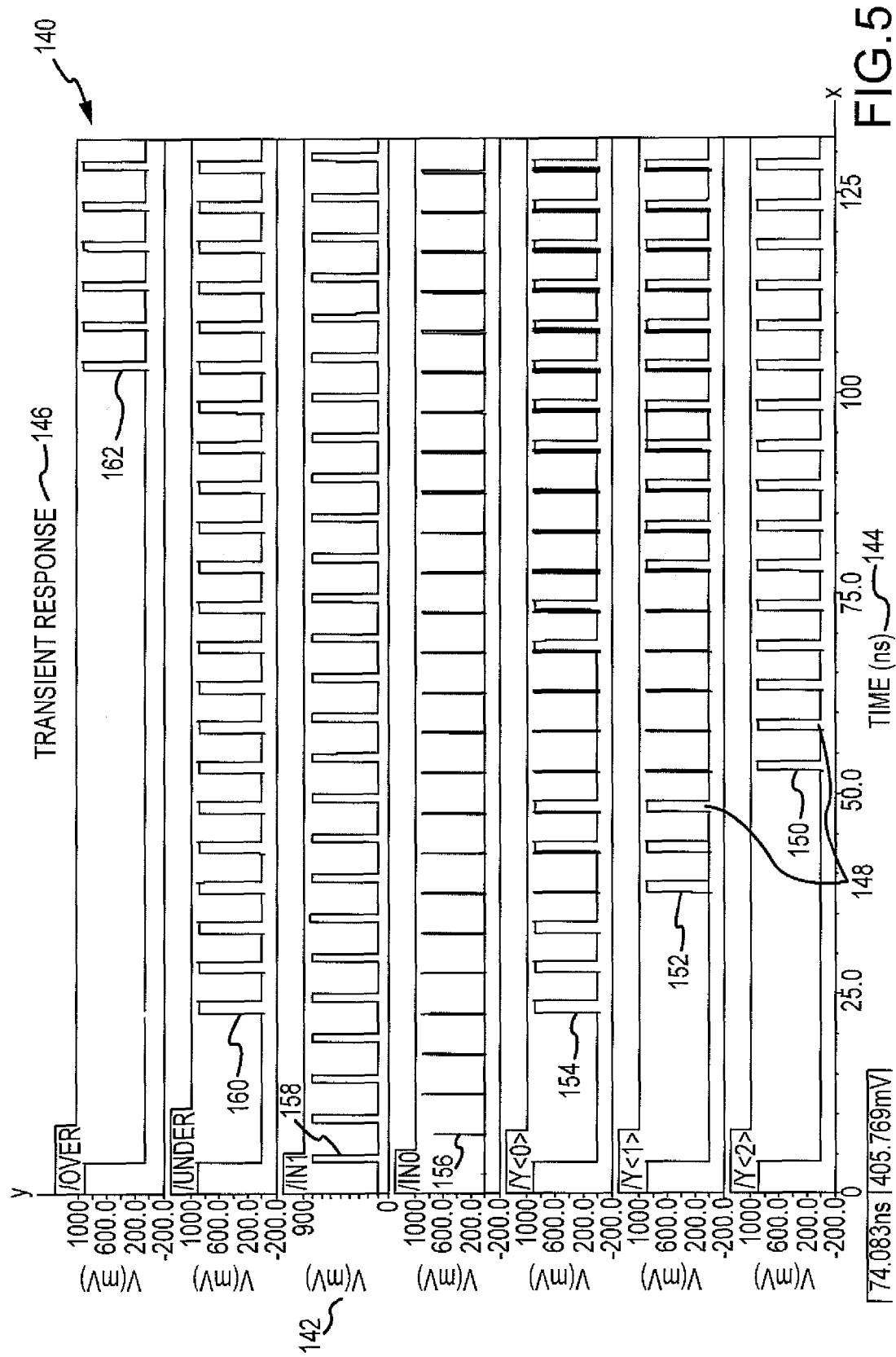
FIG. 5 is an illustration of a graph showing voltage versus time for transient response.

FIG. 5 is an illustration of a graph 140 showing voltage 142 in milliVolts (mV) along a y-axis versus time 144 in nanoseconds (ns) along an x-axis for transient response 146. Various pulse widths 148 are shown as well as digital words 150 measured at Y<2>, digital words 152 measured at Y<1>, digital words 154 measured at Y<0>, digital words 156 measured at /IN0, digital words 158 measured at /IN1, digital words 160 measured at /UNDER, and digital words 162 measured at /OVER, Many modifications and other embodiments of the disclosure will come to mind to one skilled in the art to which this disclosure pertains having the benefit of the teachings presented in the foregoing descriptions and the associated drawings. The embodiments described herein are meant to be illustrative and are not intended to be limiting. Although specific terms are employed herein, they are used in a generic and descriptive sense only and not for purposes of limitation.

What is claimed is:

1. A method for identifying and measuring a signal pulse induced in a microcircuit due to ionizing radiation comprising:
    locating an ionizing radiation induced pulse across a microcircuit using a plurality of sensors on the microcircuit;
    radiating a radiation through the microcircuit to produce a pulse width;
    calibrating a time to digital converter (TDC) with a voltage control oscillator and, an encoder, or a divider and the encoder, to determine a resolution accuracy of the pulse width and a measurement resolution of the pulse width by generating a series of multiple pulses from the voltage control oscillator and transmitting the multiple pulses either directly to the encoder, or to the divider, to a frequency counter, and then to the encoder, wherein the multiple pulses transmit with no delays and transmit with delays through eight (8) or more delay paths, and wherein the calibrating further comprises measuring a known pulse width with the TDC and stepping the pulse width to larger and larger pulses until all of a plurality of eight (8) or more different measurement delays in the TDC have been simulated, resulting in knowing what each of the TDC delays are;
    using the TDC to measure a duration of each of the pulse widths to create a measured pulse widths comprising eight (8) or more pulse width pieces of information indicating the pulse width is larger or smaller than each corresponding delay path; and
    using the TDC to directly convert on the microcircuit each of the measured pulse widths into a digital signal.

2. The method of claim 1 further comprising using a current starved inverter with the TDC to allow for a variable delay of the pulse width.

3. The method of claim 1 further comprising using the delay paths of the eight (8) or more delay paths and a digital adder with the TDC, wherein the 8 or more delay paths are compared to derive a measurement of the pulse width.

4. The method of claim 1 further comprising using the TDC for direct measurement of the pulse width on the microcircuit, wherein the pulse width is created by a single event transient (SET) or a gated clock transient caused by power on the microcircuit.

5. The method of claim 1 further comprising using the TDC to convert information on the pulse width at a TDC input into a digital word at a TDC output, wherein the digital word can be used on the microcircuit in a control loop.

6. The method of claim 1 further comprising using the TDC to convert information on the pulse width at a TDC input into a digital word at a TDC output, wherein the digital word can be transmitted to a data collection device.

7. The method of claim 1 wherein the method is used with onboard space systems comprising satellites and space shuttles, spacecraft, space systems, aircraft, craft, and vehicles.

8. The method of claim 1 wherein the microcircuit comprises an electronic integrated circuit chip.

9. The method of claim 1 wherein the plurality of sensors are spaced apart from each other on the microcircuit.

10. A method for identifying and measuring a signal pulse induced in a microcircuit due to ionizing radiation comprising:
- locating an ionizing radiation induced pulse across a microcircuit using a plurality of sensors on the microcircuit;
- radiating a radiation through the microcircuit to produce a pulse width;
- calibrating a time to digital converter (TDC) with a voltage control oscillator and, an encoder, or a divider and the encoder, to determine a resolution accuracy of the pulse width and a measurement resolution of the pulse width by generating a series of multiple pulses from the voltage control oscillator and transmitting the multiple pulses either directly to the encoder, or to the divider, to a frequency counter, and then to the encoder, wherein the multiple pulses transmit with no delays and transmit with delays through eight (8) or more delay paths, and wherein the calibrating further comprises measuring a known pulse width with the TDC and stepping the pulse width to larger and larger pulses until all of a plurality of eight (8) or more different measurement delays in the TDC have been simulated, resulting in knowing what each of the TDC delays are;
- using the TDC to measure a duration of each of the pulse widths to create a measured pulse widths comprising eight (8) or more pulse width pieces of information indicating the pulse width is larger or smaller than each corresponding delay path;
- using a current starved inverter with the TDC to allow for a variable delay of each of the pulse widths; and
- using the TDC to directly convert on the microcircuit each of the measured pulse widths into a digital signal.

11. The method of claim 10 wherein the TDC uses one or more voter latches to reduce input loading and to reduce a total number of delay paths.

12. The method of claim 10 further comprising using the TDC for direct measurement of the pulse width on the microcircuit, wherein the pulse width is created by a single event transient (SET) or a gated clock transient caused by power on the microcircuit.

13. The method of claim 10 wherein the TDC has a single event transient (SET) indication output pin to ensure that the TDC is operating properly.

14. The method of claim 10 wherein the TDC uses a multiplexer for decoding.

15. A method for identifying and measuring a signal pulse induced in a microcircuit due to ionizing radiation comprising:
- locating an ionizing radiation induced pulse across a microcircuit using a plurality of sensors on the microcircuit;
- radiating a radiation through the microcircuit to produce a pulse width;
- calibrating a time to digital converter (TDC) with a voltage control oscillator and, an encoder, or a divider and the encoder, to determine a resolution accuracy of the pulse width and a measurement resolution of the pulse width by generating a series of multiple pulses from the voltage control oscillator and transmitting the multiple pulses either directly to the encoder, or to the divider, to a frequency counter, and then to the encoder, wherein the multiple pulses transmit with no delays and transmit with delays through eight (8) or more delay paths, and wherein the calibrating further comprises measuring a known pulse width with the TDC and stepping the pulse width to larger and larger pulses until all of a plurality of eight (8) or more different measurement delays in the TDC have been simulated, resulting in knowing what each of the TDC delays are;
- using the TDC to measure a duration of each of the pulse widths to create a measured pulse widths comprising eight (8) or more pulse width pieces of information indicating the pulse width is larger or smaller than each corresponding delay path;
- using two delay paths of the eight (8) or more delay paths and a digital adder with the TDC,
- wherein the eight (8) delay paths are compared to derive a measurement of the pulse width; and
- using the TDC to directly convert on the microcircuit each of the measured pulse widths into a digital signal.

16. The method of claim 15 further comprising using the TDC for direct measurement of the pulse width on the microcircuit, wherein the pulse width is created by a single event transient (SET) or a gated clock transient caused by power on the microcircuit.

17. The method of claim 15 wherein the TDC uses a vernier delay method.

* * * * *